United States Patent [19]

Mitchell

[11] Patent Number: 4,650,921
[45] Date of Patent: Mar. 17, 1987

[54] THIN FILM CADMIUM TELLURIDE SOLAR CELL

[75] Inventor: Kim W. Mitchell, Granada Hills, Calif.

[73] Assignee: Atlantic Richfield Company, Los Angeles, Calif.

[21] Appl. No.: 790,709

[22] Filed: Oct. 24, 1985

[51] Int. Cl.⁴ .............................................. H01L 31/06
[52] U.S. Cl. .................................... 136/258; 136/256; 136/260; 136/264; 357/16; 357/30; 357/59; 357/65
[58] Field of Search .................. 136/256, 258 PC, 260, 136/264; 357/16, 30, 59 D, 65

[56] References Cited
U.S. PATENT DOCUMENTS
4,388,483  6/1983  Basol et al. ........................... 136/260

FOREIGN PATENT DOCUMENTS
55-102279  8/1980  Japan ..................................... 136/260

OTHER PUBLICATIONS

J. Calderer et al., *Solar Energy Materials*, vol. 5, pp. 337-347, (1981).
SERI Photovoltaic Advanced R&D Overview, SERI/-SP-281-2235, (Feb. 1984), p. 16.

Primary Examiner—Aaron Weisstuch
Attorney, Agent, or Firm—Robert D. Lott

[57] ABSTRACT

A phosphorous doped layer of cadmium telluride is deposited onto a conductive window layer to form a thin film cadmium telluride solar cell. Back contacts to the solar cell are made by first depositing a layer of p conductivity type lead telluride upon the cadmium telluride and then depositing the metallic back contacts onto the lead telluride.

5 Claims, 5 Drawing Figures

THIN FILM CADMIUM TELLURIDE SOLAR CELL

BACKGROUND OF THE INVENTION

This invention relates to p-n tin oxide-cadmium telluride photovoltaic cells.

Cadmium telluride has long been identified as a strong candidate for low cost, thin film, photovoltaic applications because of its direct band gap and its ability to be doped n and p type permitting formation of a variety of junction structures, and to be deposited by a variety of techniques ranging from vacuum evaporation and chemical vapor deposition to electrodeposition and screen printing.

Photovoltaic cells using polycrystalline cadmium sulfide and cadmium telluride have been described in the past. For example U.S. Pat. No. 4,207,119 to Yuan-Sheng Tyan, which is hereby incorporated by reference, describes a cadmium sulfide/cadmium telluride solar cell in which oxygen atoms are present in the cadmium sulfide and/or cadmium telluride to improve the efficiency of the cell. A disadvantage of the examples shown in the Tyan patent is the use of low pressure conditions while depositing the cadmium telluride layers. It has also been found that the addition of oxygen must be kept low during the deposition process because the oxygen can result in substantial oxidation of the cadmium telluride source thereby suppressing the deposition process.

A problem in the past in fabricating photovoltaic cells containing cadmium telluride is the formation of low resistance, electrical contacts to the cadmium telluride layer. One prior art technique is to chemically etch the cadmium telluride to form a telluride rich P+ conductivity region at the surface, then to deposit back metallization usually using high work function metals such as gold or nickel. However, contacts made by this method have not proven to be altogether satisfactory for several reasons including the sensitivity of the contact to excessive heat treatment causing chemical rections to form metal tellurides, and the present of surface oxides which tend to give rise to high contact resistances.

Therefore, it can be appreciated that a photovoltaic junction which can be formed at atmospheric pressure and under other conditions which lend themselves well to high throughput production, and a photovoltaic cell which has low resistance electrical contacts to the back conductor is highly desirable.

SUMMARY OF THE INVENTION

In accordance with the present invention, a thin film photovoltaic cell having a layer of cadmium telluride is manufactured in a process in which the cadmium telluride is deposited directly onto a conductive window layer.

Further in accordance with the present invention, a thin film photovoltaic cell having a layer of cadmium telluride is manufactured in a process in which the cadmium telluride can be deposited under atmospheric pressure conditions.

In accordance with a related aspect of the invention a photovoltaic cell is prepared which has conversion efficiencies which are improved as compared to a similar cell previously produced.

In a further aspect of the invention a cadmium telluride photovoltaic cell is produced which has a means for providing a low resistance electrical contact to a back contact of the photovoltaic cell.

As shown in an illustrated embodiment of the invention a photovoltaic cell is produced in which a conductive window layer, preferably tin oxide, is deposited upon a substrate and a cadmium telluride layer, preferably of a p conductivity type, is further deposited upon the tin oxide layer to form a p-n junction. A lead telluride layer is deposited upon the cadmium telluride layer and a metallic back contact is positioned on top of the lead telluride layer either by deposition or screen printing.

In accordance with another aspect of the invention the cadmium telluride is deposited upon the window layer in the presence of phosphine to thereby produce phosphorus atoms in the cadmium telluride layer to advantageously enhance the efficiency of the photovoltaic cell.

In accordance with a related aspect of the invention, the deposition of the cadmium telluride onto the tin oxide window layer is carried out in a reactor in which the temperature of the cadmium telluride source and the tin oxide is controlled in a manner to keep the temperature of the tin oxide at about 400° C. until the temperature of the cadmium telluride source is greater than about 600° C. thereby inhibiting the tin oxide from reducing to elemental tin and yet allowing the temperature of the tin oxide to rise above about 600° C. in order to significantly increase the transmission qualities through the tin oxide layer.

Also shown in a preferred embodiment of the invention is a structure for providing electrical contacts to the cadmium telluride layer by placing a layer of lead telluride between the cadmium telluride and the metallization back contacts.

BRIEF DESCRIPTION OF THE DRAWINGS

The above and other features of this invention may be more fully understood from the following detailed description taken together with the accompanying drawing in which.

DESCRIPTION OF THE PREFERRED EMBODIMENT

Figure 1:
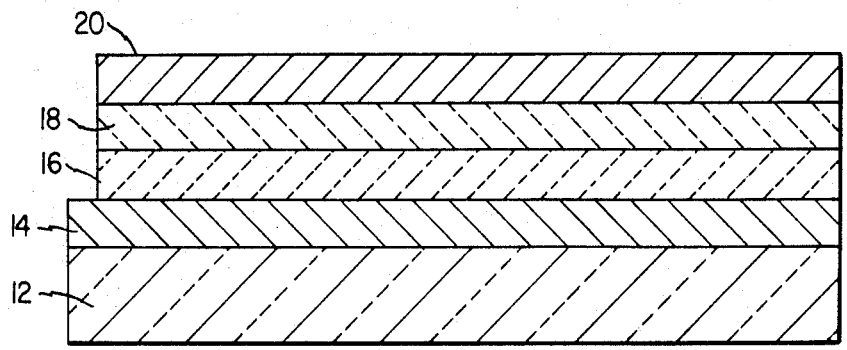
FIG. 1 is a fragmentary vertical sectional view of a photovoltaic cell according to the present invention.

Referring now to the drawings, FIG. 1 shows, in partial schematic sectional view, a cell 10 prepared in accordance with the present invention. The cell 10 consists of a substrate layer 12 which in the preferred embodiment is made from 7059 glass. Deposited onto the substrate 12 is a tin oxide layer 14. However, it will be appreciated that other materials such as cadmium stannate, can also be used for the conductive window layer 14. For a photovoltaic cell the sheet resistivity of the tin oxide is preferably less than ten ohms per square, but may be higher if the cell is to used as a photodetector. The tin oxide layer 14 is advantageously transparent and forms both the conductive window layer and the n conductivity type constituent of the photovoltaic p-n junction. Deposited on top of the tin oxide is a layer 16 of cadmium telluride which in the preferred embodiment is a polycrystalline p conductivity type material, although it is also within the scope of the present invention for the cadmium telluride to be n-type, or intrinsic, in conductivity. The preferred thickness of the cadmium telluride layer 16 is in the range of five to fifteen microns, although the thickness may be as thin as one micron for certain devices. On top of the cadmium telluride is another layer 18 consisting of lead telluride which forms a P+ conductivity type layer between the cadmium telluride layer 16 and a top conductor layer 20. The top layer 20 can be composed of any of several metals including nickel, aluminum, gold, solder, and graphite-copper, but in the preferred embodiment graphite-silver (C-Ag) is used.

Figure 2:
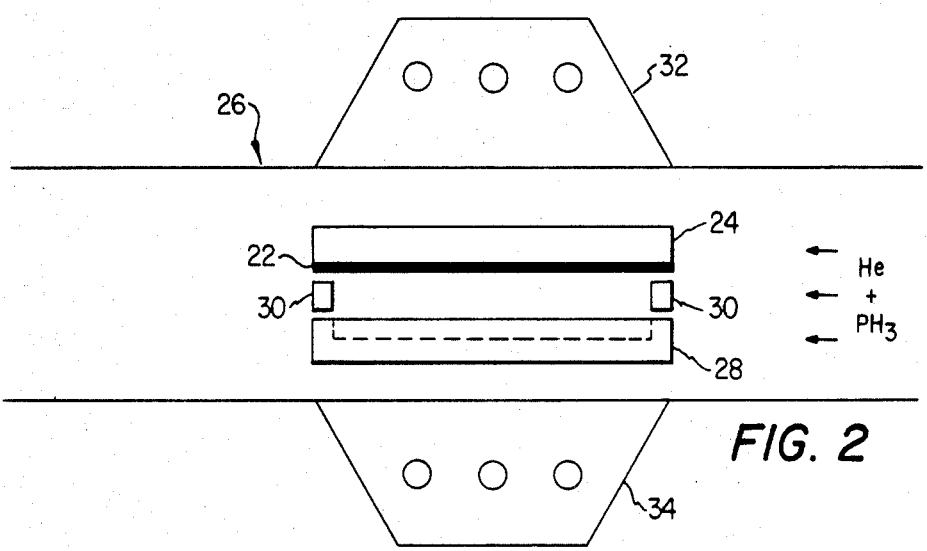
FIG. 2 is a partial schematic vertical sectional view of a chamber suitable for depositing cadmium telluride onto tin oxide.

A critical element in carrying out one aspect of the present invention is the deposition of the cadmium telluride layer 16. FIG. 2 depicts a sectional view of a chamber suitable for depositing the cadmium telluride layer 16. The substrate 12 and tin oxide layer 14, together shown as element 22 in FIG. 2, are mounted against a substrate block 24 and placed inside a quartz reactor 26. A source crucible 28 is placed inside the reactor 26 and spaced away from the substrate window layer structure 22 by spacers shown as elements 30. Mounted on either side of the quartz reactor 26 are a pair of heat lamps 32 and 34. Heat lamp 32 is positioned to heat substrate block 24 and is hereinafter referred to as the substrate lamp 32. The heat lamp 34 is positioned to heat the source crucible 28 and is hereinafter referred to the source lamp 34. In the preferred procedure for carrying out the present invention the cadmium telluride source is ground cadmium telluride powder (Alpha Ultapure #87821) held in the source crucible 28 which is heated by the source lamp 34 to vaporize and become deposited upon the tin oxide through the process of close-space vapor transport (CSVT). The spacers 30 are less than one centimeter in width and the substrate structure 22 is typically ten centimeters by ten centimeters in size. Although not shown in FIG. 2, additional elements which may be used including a mask placed in front of the substrate structure 22 for patterning the cadmium telluride deposited onto the structure 22, and shutters mounted on crucible 28 which can be remotely activated to contain the cadmium telluride vapors until the temperature of the cadmium telluride source is at a desired temperature. During the cadmium telluride growth, the atmosphere inside the reactor 26 is helium with 200 PPM of phosphine ($PH_3$). The $PH_3$ provides phosphorus atoms for the cadmium telluride layer 16. Phosphorus is a well known acceptor dopant. The pressure inside the quartz reactor 26 may be atmospheric pressure thereby reducing the amount of time and equipment required during the manufacturing process as compared to a low pressure process. On the other hand, it has been found that the deposition of cadmium telluride occurs faster during CSVT when the atmospheric pressure is reduced to about 1 TORR.

The apparatus shown in FIG. 2 allows precise control of deposition parameters. Using instrumentation not shown in FIG. 2, independent control of gas flows, chamber pressure, and source and substrate temperatures can be achieved.

In order for the photovoltaic cell to be efficient, the window layer, in this case tin oxide, must be compatible with the layer disposed upon it, in this case cadmium telluride, and with other subsequent processing. Experiments were made in which the optical transmission and x-ray diffraction were measured for different heat treatment conditions of the tin oxide. It was found that for an ambient condition of one atmosphere of hydrogen the tin oxide should not be exposed to temperatures above 450° C., otherwise the reduction of the tin oxide to elemental tin occurs with the consequent loss in optical transmission. Unfortunately, experiments with cadmium telluride grown on tin oxide previously deposited onto 7059 glass and then heated to 450° C. produced a low quality cadmium telluride crystalline structure which had less than 5% optical transmission below the cadmium telluride band gap, and that temperatures of about 600° C. were necessary for high quality cadmium telluridge indicated by below band optical transmissions of about 67 percent, which, considering reflection losses, is considered ideal.

Figure 3:
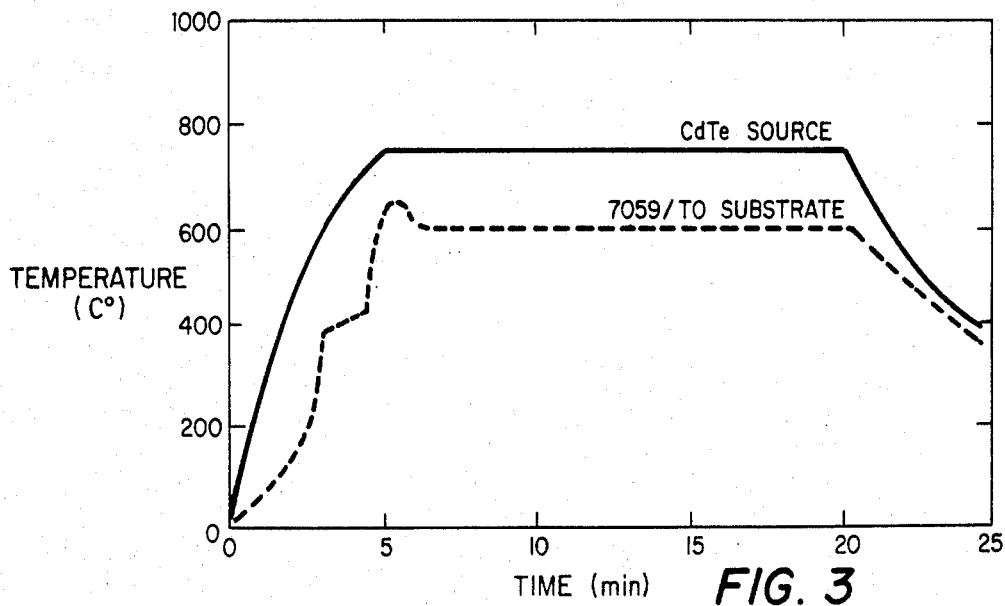
FIG. 3 is a plot of the temperatures of the cadmium telluride source and the glass-tin oxide substrate during the deposition of the cadmium telluride.

Advantageously, it was discovered that it is possible to raise the temperature of the tin oxide layer to about 600° C. without causing a degradation or reducing of the tin oxide to elemental tin. The solution involves heating the source crucible and then heating the substrate in a defined manner as shown in FIG. 3 so that the temperature of the substrate was kept below 450° C. until the temperature of the source crucible reached 600° C., then the substrate was quickly heated to 650° C. to improve initial film growth and cooled to 509° C. to complete the film growth. The resultant cadmium telluride layer was 10.3 microns thick.

In order to form the photovoltaic junction between the tin oxide and cadmium telluride, it is necessary that one of the layers be of p conductivity type, generally the cadmium telluride layer, and the other layer be of n conductivity type, generally the tin oxide layer. Advantageously, the deposition technique described above produces a tin oxide layer which is inherently n conductivity type and a cadmium telluride layer which is doped with acceptor type atoms to become p conductivity type.

It was also found that the use of phosphorus in the form of $PH_3$ mixed with the helium in the quartz reactor tube 26 improves the efficiency of the resulting photovoltaic cell by producing a p conductivity type layer to promote a relatively high voltage pn junction.

Figure 4:
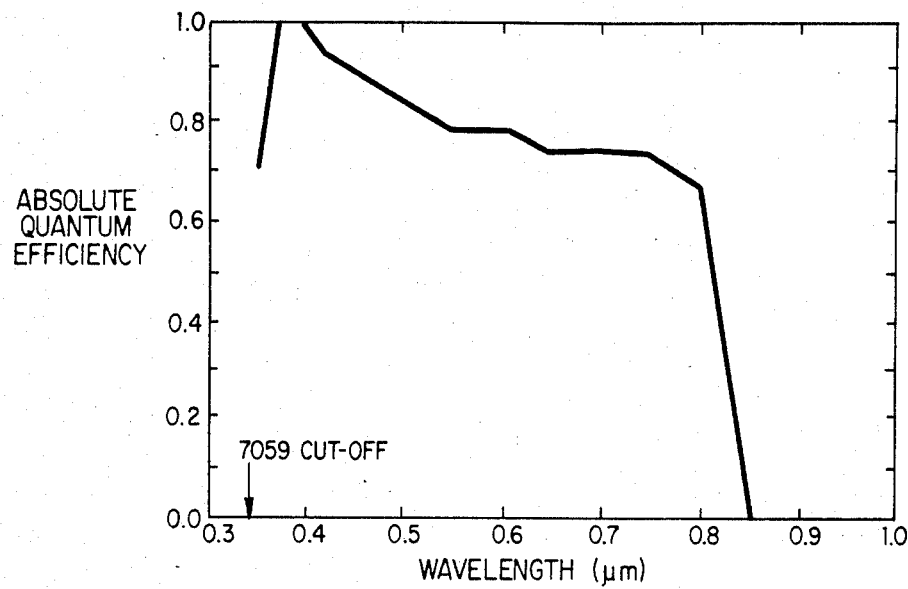
FIG. 4 is a plot of the absolute quantum efficiency versus wavelength of a photovoltaic cell having a tin oxide/cadmium telluride photovoltaic junction formed according to the present invention.
Figure 5:
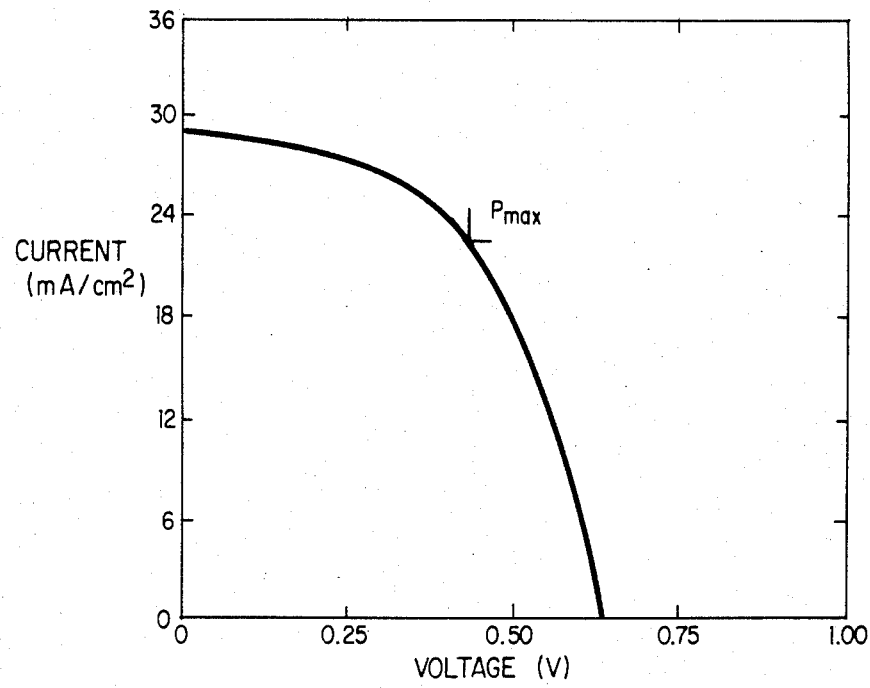
FIG. 5 is a plot of the voltage/current characteristics of a photovoltaic cell in which a tin oxide/cadmium telluride photovoltaic junction is formed according to the present invention.

A photovoltaic cell was fabricated in the manner described above with the spectral response shown FIG. 4 and the voltage current characteristics of the cell shown in FIG. 5. The quantum efficiencies shown in FIG. 5 are above unity near the tin oxide cutoff and are not understood. But these characteristics have also been seen in other devices and it is theorized that the efficiency shown may be due to avalanche effects or to current densities which are light dependent. As shown in FIG. 5, the short circuit current for this example was 28.8 milliamperes per square centimeter, with an open circuit voltage of 0.642 volts and a fill factor of 0.524. The efficiency of the 4 square centimeter cell was 9.7 percent. In this experimental cell the back surface of the cadmium telluride was etched for ten seconds with an etch of 1.25 ml $HNO_3$: 100 ml $H_3PO_4$ and graphite-silver was then screen printed onto the etched cadmium telluride to form the back contact.

However, the back contact can also be formed by first depositing a layer of tellurium rich lead telluride onto the cadmium telluride using vacuum evaporation of lead telluride. The lead telluride is evaporated at 600° C. to 800° C., and the lead telluride must be raised to this temperature rapidly in order to keep the lead telluride tellurium rich to preserve the p conductivity type characteristics of the lead telluride. It is theorized that if the lead telluride is allowed to heat up slowly, the tellurium tends to separate from the lead, causing the resultant layer to be of less p conductivity type. After the lead telluride film is deposited, a suitable metal such as graphite-silver, gold, nickel, aluminum, solder, or graphite-copper, may be deposited onto the lead telluride to form the back contact. Analysis of back contacts formed in this manner show a ohmic junction of relatively low resistivity which are stable.

An alternative method using close-space vapor transport has also been used to deposit the layer of lead telluride. This method of deposition combined with the process described above has the advantage of permitting the production of photovoltaic cell entirely at atmospheric pressure.

As can be seen from this description, several major advantages arise from this invention. A photovoltaic cell has been described which is formed by the junction of tin oxide and cadmium telluride without an intervening cadmium sulfide layer in which phosphorus has been used to increase the efficiency of the cell, and a method to provide good ohmic contacts to the cadmium telluride layer has been described. Moreover, the process described is suited for an industrial mass production of photovoltaic cells which does not not require special crystal growing equipment, in which the fabrication of a photovoltaic cell can be carried out in atmospheric pressure conditions.

Although the invention has been described in detail with particular reference to a preferred embodiments, it will be understood by those skilled in the art that modifications and variations can be made to the described embodiments without departing from the spirit and scope of the invention.

I claim:
1. A photovoltaic cell comprising:
   (a) a substrate layer consisting of a transparent or semi-transparent material;
   (b) an n conductivity type layer of tin oxide contiguous to said substrate layer;
   (c) a p conductivity type layer of polycrystalline cadmium telluride contiguous to said layer of tin oxide thereby forming a pn junction, said layer of cadmium telluride containing atoms of phosphorus; and
   (d) a layer of lead telluride contiguous to said layer of said cadmium telluride.

2. A photovoltaic cell as set forth in claim 1 further including a conductive layer contiguous to said lead telluride layer whereby said conductive layer and said tin oxide layer form electrodes for said photovoltaic cell.

3. In a photovoltaic cell having a layer of cadmium telluride and an electrode in nonrectifying electrical contact with said cadmium telluride layer, the improvement comprising a layer of lead telluride interposed between said cadmium telluride layer and said electrode.

4. A cell as set forth in claim 3 wherein said cadmium telluride layer and said lead telluride layer are of p conductivity type.

5. A cell in set forth in claim 3 wherein said electrode is composed of one of the metal containing materials chosen from the group of graphite-silver, nickel, aluminum, gold, solder, and graphite-copper.

* * * * *